(12) United States Patent
Chiu et al.

(10) Patent No.: US 9,018,020 B2
(45) Date of Patent: Apr. 28, 2015

(54) SHUNT TREATMENT IN INVERTED AND WAFER BONDED SOLAR CELLS

(71) Applicant: The Boeing Company, Chicago, IL (US)

(72) Inventors: Philip Chiu, La Crescenta, CA (US); Shoghig Mesropian, Tarzana, CA (US); Dimitri D. Krut, Encino, CA (US)

(73) Assignee: The Boeing Company, Chicago, IL (US)

( * ) Notice: Subject to any disclaimer, the term of this patent is extended or adjusted under 35 U.S.C. 154(b) by 74 days.

(21) Appl. No.: 13/901,774

(22) Filed: May 24, 2013

(65) Prior Publication Data
US 2014/0345683 A1    Nov. 27, 2014

(51) Int. Cl.
| | |
|---|---|
| H01L 21/00 | (2006.01) |
| H01L 31/0463 | (2014.01) |
| H01L 31/0445 | (2014.01) |
| H01L 31/046 | (2014.01) |
| H01L 31/18 | (2006.01) |
| H01L 31/02 | (2006.01) |
| H01L 31/0687 | (2012.01) |

(52) U.S. Cl.
CPC .......... *H01L 31/0201* (2013.01); *H01L 31/186* (2013.01); *H01L 31/06875* (2013.01); *H01L 31/1896* (2013.01); *Y10S 136/29* (2013.01)

(58) Field of Classification Search
CPC ..... G03F 7/20; G03F 7/36; H01L 31/022433; H01L 31/1876
USPC .................. 438/4, 98; 257/448; 136/256, 290
See application file for complete search history.

(56) References Cited

U.S. PATENT DOCUMENTS

| | | | |
|---|---|---|---|
| 4,287,473 A * | 9/1981 | Sawyer | 324/754.23 |
| 7,256,140 B2 * | 8/2007 | Call et al. | 438/758 |
| 7,979,969 B2 * | 7/2011 | Basol | 29/402.06 |
| 7,989,729 B1 * | 8/2011 | Zhao et al. | 219/121.76 |
| 8,237,049 B2 | 8/2012 | Kinsey et al. | |
| 2005/0150543 A1 | 7/2005 | Nakashima et al. | |
| 2007/0275545 A1 * | 11/2007 | Call et al. | 438/469 |
| 2010/0210040 A1 | 8/2010 | Basol | |
| 2010/0283126 A1 | 11/2010 | Kiriyama et al. | |
| 2012/0329199 A1 | 12/2012 | Kukulka | |

FOREIGN PATENT DOCUMENTS

WO    2011136659 A1    11/2011

OTHER PUBLICATIONS

"Int'l Application Serial No. PCT/US2014/033681, Search Report and Written Opinion mailed Sep. 18, 2014", 11 pgs.

* cited by examiner

*Primary Examiner* — Evan Pert
(74) *Attorney, Agent, or Firm* — Kwan & Olynick LLP

(57) ABSTRACT

Provided are methods and systems for treating shunts on solar cell substrates. Also provided are solar cells including such substrates. A shunt detected on a substrate proximate to a metallized grid pattern is electrically disconnected from at least the bus portion of the grid, which reduces shunt's impact on performance on the solar cell. An antireflective layer may be disposed between the shunt and a portion of the grid extending over the shunt. The exposure pattern of a photoresist used to form the antireflective layer may be adjusted accordingly to achieve this result. In some embodiments, the metallized grid may be modified by adjusting the exposure pattern of a photoresist used to form this grid. The grid may be modified to avoid any contact between the grid and the shunt or to disconnect a portion of the grid contacting the shunt from the bus portion area of the grid.

20 Claims, 7 Drawing Sheets

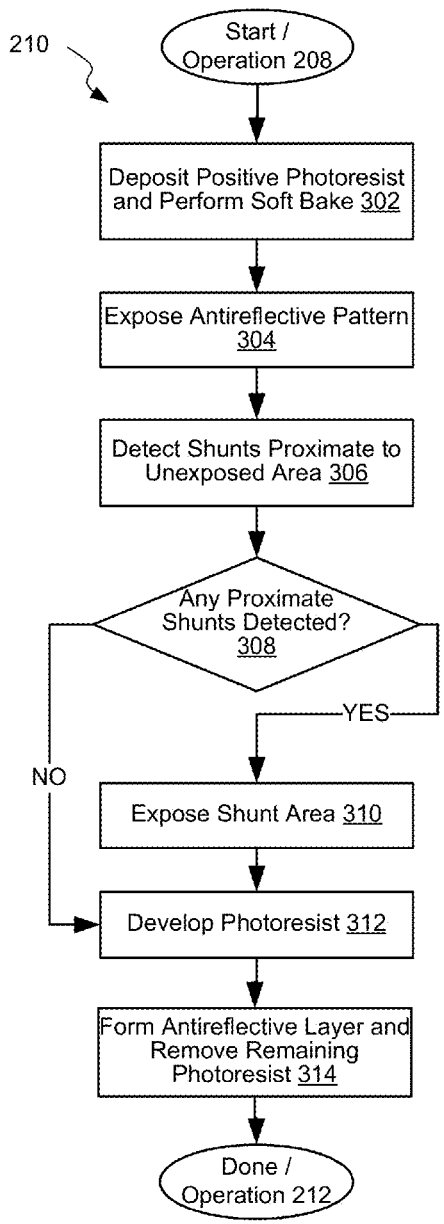
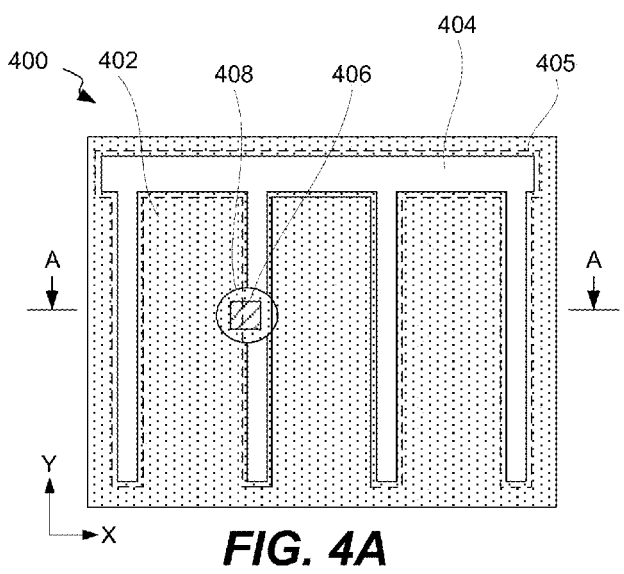
FIG. 4A
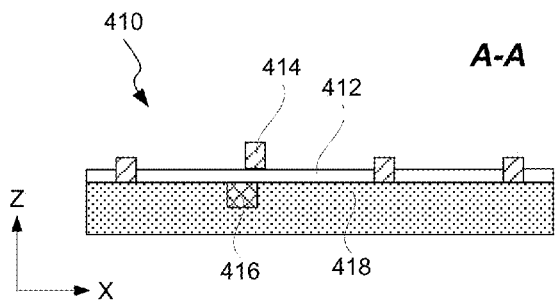
FIG. 4B
FIG. 3

SHUNT TREATMENT IN INVERTED AND WAFER BONDED SOLAR CELLS

FEDERALLY SPONSORED RESEARCHED OR DEVELOPMENT

This invention was made with government support under Contract Number NRO 000-11-C-0368 awarded by The National Reconnaissance Office (NRO). The United States Government has certain rights in the invention.

BACKGROUND

A solar cell is a device that is capable of converting sunlight into electrical energy by the photovoltaic effect. A solar cell, such as a multijunction solar cell, can have one or more p-n junctions that are sometimes referred to as subcells. These junctions may be connected in series to form a multijunction solar cell but may also be connected in other electrical configurations, such as in parallel, or in a combination of series and parallel connections.

The interest in solar cells has been increasing due to concerns regarding pollution, energy security, and limited availability of other energy sources. This interest has been for both terrestrial and space applications. In space applications, solar cells have been in use for many years and the development of higher efficiency solar cells allows increased payload capabilities. In terrestrial applications, higher solar cell efficiency for conversion of the sunlight into electrical energy results in a smaller cell area required for a given electrical power output, and therefore lower cost per watt and greater cost effectiveness.

However, solar cell fabrication processes are prone to introducing various defects into solar cell structures, such as the interface between a multijunction stack and a substrate, which may render the cells unsuitable for operation. The defects can be reduced to a certain extent by various process control measures, which add significant costs and delays to fabrication of the solar cells. It has been found that some defects, if detected and treated, can remain within the solar cells without impacting performance of these solar cells.

SUMMARY

Provided are methods for treating shunts on solar cell substrates. These methods may be integrated into overall solar cell fabrication processes. In some embodiments, a method involves detecting a shunt on a solar cell surface proximate to a metallized grid pattern. For example, the shunt may overlap with the metallized grid pattern or some larger area, such as an offset area surrounding the metallized grid pattern. The detection may involve an optical inspection of the solar cell substrate after exposing a photoresist used for an antireflective layer or after exposing a photoresist used for a metallized grid. The method may proceed with exposing a portion of the photoresist disposed on the surface of the solar cell substrate. The exposed portion may cover at least an overlap area of the shunt and the metallized grid pattern. In some embodiments, the exposed portion cuts across a portion of the metallized grid pattern extending between the shunt and a bus portion of the metallized grid pattern. As such, when the metallized grid is formed, at least the bus portion of the metallized grid is electrically isolated from the shunt.

Provided also are inverted and direct wafer bonded solar cells. In some embodiments, a cell includes a substrate having one of an inactive handle or an active cell substrate. The cell also includes a multijunction stack disposed over the substrate. The stack may be bonded to the substrate using various suitable techniques and may include a shunt defect. The multijunction solar cell also includes a metallized grid disposed over the stack such that the stack is disposed between the metallized grid and the substrate. The shunt may be disconnected from at least a bus portion of the metallized grid by an antireflective layer extending between the shunt and a portion of the metallized grid extending over the shunt. In some embodiments, the shunt may be disconnected from the bus portion by the metallized grid not extending over the shunt. In both of these situations, the shunt is not only disconnected from the bus portion of the metallized grid, but it also disconnected from the entire metallized grid. In some embodiments, the shunt may be disconnected from the bus portion by a portion of the metallize grid contacting the shunt being disconnected from the bus portion of the metallized grid. In other words, the shunt may contact and be connected to a portion of the metallized grid but this portion itself is disconnected from the bus portion. In some embodiments, multiple shunts may be connected to the same portion of the metallized grid that is disconnected from the bus portion. As such, only one modification to the metallized grid may be implemented to treat multiple shunt defects.

Provided also are apparatuses for treating shunts on solar cell substrates. In some embodiments, an apparatus includes a detection unit configured to detect a shunt on a solar cell substrate proximate to the metallized grid pattern. The apparatus may also include an exposure unit configured to expose a portion of a photoresist disposed on the surface of the substrate. The exposed portion of the photoresist covers at least an overlap area of the shunt and the metallized grid pattern or cuts across a portion of the metallized grid pattern extending between the shunt and a bus portion of the metallized grid pattern. Furthermore, the detection unit is configured to communicate a location of the shunt on the solar cell substrate to the exposure unit.

These and other embodiments are described further below with reference to the figures.

BRIEF DESCRIPTION OF THE DRAWINGS

FIG. 3 is a process flowchart corresponding to a method for treating shunts on solar cell substrates, in accordance with some embodiments.

FIG. 4A is a schematic top view of a solar cell substrate after treating the shunt in accordance with operations depicted in FIG. 3.

FIG. 4B is a schematic cross-sectional view of a solar cell that includes the solar cell substrate and the treated shunt illustrated in FIG. 4A, in accordance with some embodiments.

DETAILED DESCRIPTION OF EXAMPLE EMBODIMENTS

Figure 1A:
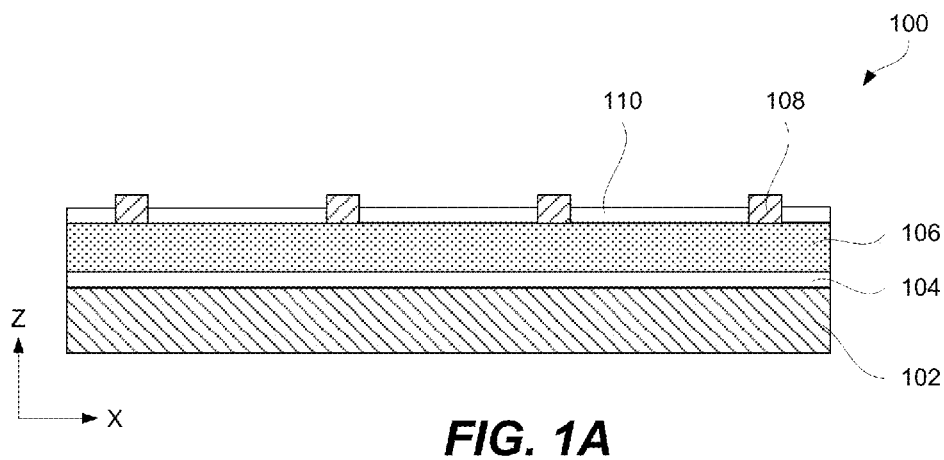
FIG. 1A is a schematic cross-sectional view of an inverted and wafer bonded solar cell illustrating various components of the cell, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Several high efficiency space and terrestrial solar cell technologies include inverted metamorphic (IMM) and direct bonded cells. These cells are grown inverted relative to more conventional multijunction devices. For example, the top layer in the operation configuration, which may be also referred to as a light facing layer, is grown first, lattice matched to a growth substrate. One example of the top layer may include gallium indium phosphide (GaInP), which has a band gap of about 1.8 eV, and it may be grown on gallium arsenide substrate (GaAs). Additional layers are then deposited onto the top layer, such as either a gallium arsenide (GaAs) layer having a band gap of about 1.4 eV or a minimally mismatched gallium indium arsenide (GaInAs) layer. The additional layers may also include a transparent gallium indium phosphide (GaInP) layer and a metamorphic indium gallium arsenide (InGaAs) having a band gap of about 1.0 eV. All of these layers formed on the growth substrate may be referred to as a stack. This is just one example of inverted solar cells provided for better understanding of various features described below. This direction of growth helps prevent threading dislocations from degrading the higher band gap cells where most of the power is generated. During fabrication of an inverted solar cell, a new substrate is bonded to the stack, and the growth substrate is removed. The stack is flipped during these operations from its growth orientation to its operating orientation.

However, epitaxial growth can cause formation of various foreign structures when wafer bonding and substrate removal processes are used. These foreign structures can cause shorts within the stack, particularly when subjected to a potential of the metallized grid, resulting in deterioration of cell performance. As such, these foreign structures may be referred to as shunts. Sources of the shunts may be various, such as epitaxial growth defects or contamination of the processed surfaces and/or processing environment. Various previous attempts focused on prevention of shunt formations in cells. However, complete removal of shunts is difficult and very expensive, if possible at all. These previous attempts proved to be inconsistent and unreliable and shunts continuously appear on the surface of the top layer of the cells.

Provided are methods and systems for treating shunts on various solar cell substrates. The methodology used may be referred to as spot knocking. It reduces the effect of the shunts on cell performance and improves fabrication yields. Instead of discarding a cell that includes one or more shunts, the cell structure is modified to reduce the effects of these shunts on the cell performance. The methodology is based on a localized photoresist exposure technique that prevents metallized grid lines from contacting the shunts or at least electrically isolates these shunts from the bus bar portion of the metallized grid line. This technique relies on the fact that shunts are electrically active mainly when a metallized grid potential is applied to these shunts. When the method for treating shunts is completed, the solar cell substrate may continue down the fabrication process. The solar cell performance is maintained even though one or more shunts may be present following the bonding and growth substrate removal operations.

Specifically, a shunt detected on a substrate proximate to a metallized grid pattern is electrically disconnected from at least the bus portion of the grid. For purposes of this document, the shunt is considered to be proximate to the metallized grid when such relative position of these two components impacts performance of the cell. In other words, the shunt is considered to be proximate to the metallized grid when the resistance between the two components is smaller than a certain allowed threshold. For example, the metallized grid may extend over and touch the shunt. However, in some embodiments, even though the metallized grid does not extend over and does not touch the shunt, it may be considered proximate. Furthermore, when proximity of a shunt and a metallized grid pattern is considered, various allowable tolerances during fabrication of the metallized grid should be considered. In light of the above, one having ordinary skills in the art would understand the proximity consideration used in this description.

The break in the electrical connection between the shunt and at least the bus portion of the grid may be achieved by modifying the pattern of an insulating antireflective layer, modifying the pattern of the metallized grid, or both. For example, the insulating antireflective layer may be disposed between the shunt and a portion of the grid extending over the shunt, which may be referred to as the shunt isolation approach. The exposure pattern of a photoresist used to form the insulating antireflective layer may be adjusted accordingly to achieve this result. The metallized grid pattern may not be modified in this approach and still allowed to extend over the shunt with the antireflective layer providing an insulating barrier. In other words, shunts may be deactivated without breaking or otherwise altering the metallized grid lines. However, separation between the exposed and unexposed photoresist defining the antireflective layer pattern may be difficult to detect at this stage.

In some embodiments, the metallized grid pattern is modified instead of or in addition to modifying the antireflective layer pattern. This grid modification approach may be achieved by adjusting the exposure pattern of a photoresist used to form the metallized grid. The grid may be modified to avoid any contact between the grid and the shunt, which may be referred to as a grid modification by shunt exclusion approach. In another approach, the grid may be modified to disconnect a portion of the grid contacting the shunt from the bus portion area of the grid, which may be referred to as a grid modification by shunt disconnection approach. Even though some lines of the metallized grid may be broken using these grid modification approaches, the overall effect on the fill factor of the cell may be minimal. It should be noted any of the approaches for treating shunts may be used independently from each other or in various combinations. In some embodiments, multiple approaches may be used to treat the same substrate or even the same shunt.

The disclosure provides for solar cells, such as inverted multijunction and direct bonded solar cells that may be used in satellites, spacecraft, and other space related applications; solar powered aircraft, high altitude unmanned aircraft, and other suitable aircraft applications; applications where high specific power is needed; portable power applications; and other suitable applications. Accordingly, one having ordinary skills in the art will recognize and appreciate that the solar cells and methods for fabricating these cells, or more specifically for treating shunts, may be used in any number of applications involving satellites, spacecraft, and other space related applications; solar powered aircraft, high altitude unmanned aircraft, and other suitable aircraft applications; applications where high specific power is needed; portable power applications; and other suitable applications.

Solar Cell Examples

The following description of solar cells is presented to provide better understanding of various features of methods for treating shunts on solar cell substrates and, more generally, methods for fabricating the solar cells. FIG. 1A is a schematic cross-sectional view of a solar cell 100, in accordance with some embodiments. Solar cell 100 includes a substrate 102 and a multijunction stack 106 bonded to substrate 102 using a bonding layer 104, which may include adhesive, metal eutectics, or any other suitable materials. In general, any bonding technique may be used to bond multijunction stack 106 to substrate 102. Substrate 102 is a substrate present in a fabricated cell and should be distinguished from a growth substrate temporarily used during fabrication of the cell. Substrate 102 may be referred to a final substrate or an operating substrate. Solar cell 100 also includes a metallized grid 108 and an antireflective layer 110 disposed on the top surface of multijunction stack 106.

Substrate 102 may be a handle substrate including a material, such as silicon, silicon on sapphire, amorphous silicon, aluminum, germanium, or another suitable material. In some embodiments, the material is silicon. Silicon is about half the density and mass of germanium. Silicon has less mass and can result in the overall solar cell assembly having less mass, making cells more suitable for space and aircraft applications. In some embodiments, amorphous silicon may be used and, in some embodiments, may include a p-n junction. Substrate 102 may have a p-n junction to provide further power in the overall multijunction stack. The p-n junction may be an epitaxially p-n junction or diffused p-n junction. Substrate 102 may also include or function as a bypass diode.

Multijunction stack 106 includes multiple layers of different materials having different band gaps. Combinations of these layers may be referred to as subcells. For example, one side of multijunction stack 106 may include a first layer, while the opposite side may include a second layer having a band gap lower than the band gap of the second layer. The first layer may be referred to as a high band gap layer, while the second layer may be referred to as a low band gap layer. In some embodiments, multijunction stack 106 may include one or more additional layers disposed between the high band gap layer and the low band gap layer. These middle layers may be referred to as mid band gap layers and have the band gaps lower than the band gap of the high band gap layer and higher than the band gap of the low band gap layer.

One example of solar cell 100 is an inverted and direct wafer bonded solar cell. In this cell, the high band gap layer is formed before the low band gap layer even though the high band gap layer becomes the top layer or, more specifically, the light facing layer. The high band gap layer and then all remaining layers of multijunction stack 106 are formed on a growth substrate, which is sometimes referred to as a temporary substrate. When multijunction stack 106 is positioned on the growth substrate, the low band gap layer is temporarily exposed. Then multijunction stack 106 or, more specifically, the low band gap layer, is bonded to a new substrate. The growth substrate is removed and multijunction stack 106 is flipped or inverted. At this point, the high band gap layer is exposed and may now be referred to as a top layer.

Another example of solar cell 100 is a direct bonded solar cell. Similar to the inverted metamorphic cell, high band gap layers are grown inverted on a growth substrate, which may be referred to as temporary handle. Another set of lower band gap junctions is grown upright on another substrate. All junctions are grown lattice matched to maintain cell performance in all junctions. The substrates, such as wafers, are then bonded directly together without any adhesives or metal bonds. The direct bond provides high transparency and conductivity through the bond interface. Following the direct bond, the growth substrate on the high band gap cell side is removed and the multijunction stack 106 is flipped or inverted.

In some embodiments, multijunction stack 106 includes a layer of gallium indium arsenide (GaInAs) or another suitable material. Another layer may include a transparent buffer material or another suitable material. In some embodiments, multijunction stack 106 may include another layer of gallium indium arsenide (GaInAs) or another suitable material, such that the transparent buffer layer is disposed between two gallium indium arsenide layers. In some embodiments, multijunction stack 106 includes gallium indium phosphide (GaInP) or another suitable material. Overall, multijunction stack 106 may include may be formed of any suitable combination of group III to group V elements listed in the periodic table subject to lattice constant and band gap requirements, wherein the group III elements include boron (B), aluminum (Al), gallium (Ga), indium (in), and thallium (T); the group IV elements include carbon (C), silicon (Si), germanium (Ge), and tin (Sn); and the group V elements include nitrogen (N), phosphorous (P), arsenic (As), antimony (Sb), and bismuth (Bi). Although four layers are described above, more than four solar cell layers, or one, two, or three layers may also be used to form multijunction stack 106. The layers may each have a thickness in the range of about 0.1 micron to about 4 microns. Solar cell 100 may be fabricated as a part of an array including vertical multifunction structures with the individual layers of multijunction stack 106 connected together in a series. The shape and structure of an array, as well as the number of cells it contains, are determined in part by the desired output voltage and current.

As noted above, multijunction stack 106 is bonded to substrate 102 using bonding layer 104. In some embodiments, bonding layer 104 includes a conductive bonding material, such as silicone, epoxy, solder, braze, or another suitable conductive bonding material. The conductive characteristics of the bonding material may be used to maintain the preferable two-terminal device configuration.

Figure 1B:
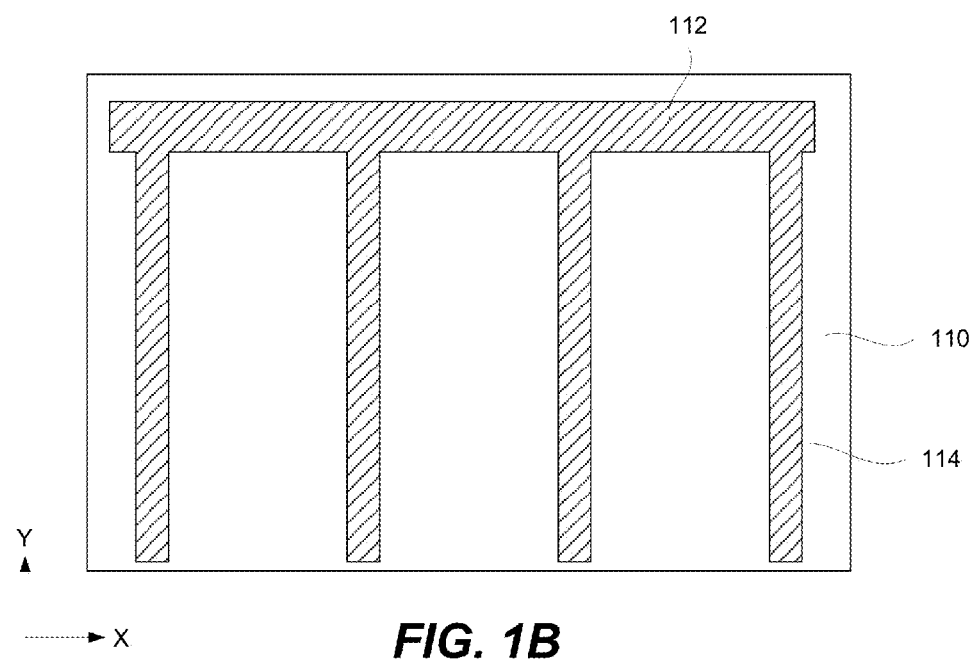
FIG. 1B is a schematic top view of an inverted and wafer bonded solar cell illustrating components of the metallized grid, in accordance with some embodiments.

Metallized grid 108 is disposed over multijunction stack 106 and used for current collection. Various configurations of metallized grid 108 are possible. As shown in FIG. 1B, the metallized grid may include multiple grid lines 114 extending parallel to each other and a common bus portion 112 connecting each of multiple grid lines 114. Common bus portion 112 may extend along one edge of multijunction stack 106. The metallized grid may be formed by various techniques, such as by e-beam or thermal vapor deposition. Antireflective layer 110 is also disposed over multijunction stack 106 in between metallized grid 108. Antireflective layer 110 may be formed by e-beam or thermal vapor deposition from various suitable materials, such as titanium oxide ($TiO_x$), aluminum oxide ($Al_2O_3$), and silicon nitride ($Si_3N_4$) in one embodiment.

Shunts (not shown in FIG. 1) may be present within multijunction stack 106. Shunts may be also referred to as square defects and crystallographic defects. Shunts may be generated as epitaxial-defects during epitaxial growth or during processing steps up to and including the wafer bonding step. These shunts may be at the top surface of multijunction stack 106 facing metalized grid 108. When the shunts are exposed to the operating potential of metalized grid 108 that may cause electrical shorts within multijunction stack. The size of shunts may range between about 10 micrometers and 2 millimeters or, more specifically, between about 50 micrometers and 1 millimeter.

Processing Examples

Figure 2:
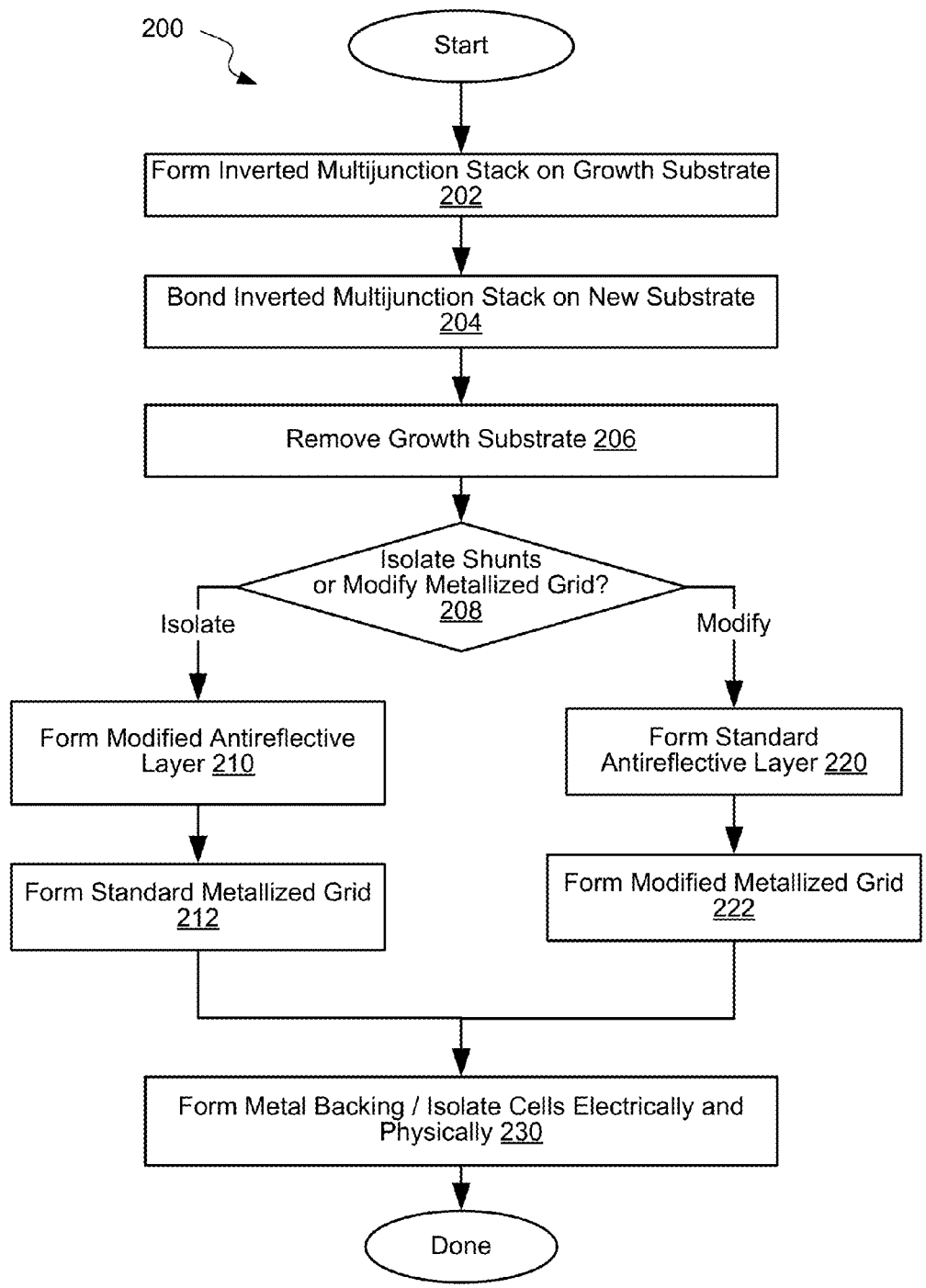
FIG. 2 is a process flowchart corresponding to a method for fabricating an inverted and wafer bonded solar cell that involves treating shunts the substrate of this cell, in accordance with some embodiments.

FIG. 2 is a process flowchart corresponding to a method 200 for fabricating solar cells, which involves treating shunts on solar cell substrates of these cells, in accordance with some embodiments. As shown, method 200 may involve various fabrication operations in addition to shunt detecting and treating operations. For example, method 200 may start with forming an inverted multijunction stack on a growth substrate during operation 202. Some examples of temporary substrates include gallium arsenide (GaAs) or germanium (Ge). As described above, the inverted multijunction stack includes multiple layers having different band gap characteristics. After completing operation 202, the high band gap layer faces the temporary substrate.

Method 200 may proceed with bonding the inverted multijunction stack with the growth substrate onto a new substrate during operation 204. Various bonding techniques may be used, such as direct bonding, metal bonding, and adhesive bonding. Examples of the new substrate include an inactive handle or an active substrate that includes other p-n junctions. A bonding layer may be formed between the inverted multijunction stack and the new substrate.

Method 200 may then proceed with removing the growth substrate during operation 206. For example, chemical-mechanical polishing (CMP) or other suitable techniques may be used. After this operation the highest band gap layer of the inverted multijunction stack is exposed and its surface becomes available to receive a metallized grid and antireflective layer. However, the inverted multijunction stack may include various shunts that may come in contact with the metallized grid when the grid is formed. This contact may impact performance of the solar cell and should be avoided if possible.

To avoid this contact, method 200 may proceed with isolating the shunts from the metallized grid and/or modifying the metallized grid to prevent the contact between the shunts and the grid or to disconnect portions of the grid, which come in contact with the shunts, from the bus bar portion of the metal grid. One or more of these approaches may be selected during the process as reflected by decision block 208 in FIG. 2. The first approach, in which the shunts are physically and electrically isolated from the metallized grid without modifying the metallized grid may be referred to as a shunt isolation approach. In order to provide this isolation, an antireflective layer is modified instead. The antireflective layer is made from electrically insulating materials and provides enough isolation to the shunts that are proximate to the metallized grid. For example, an antireflective layer extends into any area in which a grid line or a bus line extends over a shunt, thereby providing electrical isolation. This approach is further described below with reference to FIGS. 3-4B.

The second approach, in which the metallized grid is modified to isolate at least the bus portion of the metallized grid from the shunt or the entire metallized grid from the shunt, may be referred to as a grid modification approach. The grid modification approach may be further divided into a grid modification by shunt exclusion approach and into a grid modification by shunt disconnection approach. The grid modification by shunt exclusion approach prevents any electrical connections between any portions of the metallized grid. The metalized grid is modified to prevent these electrical connections when it is detected that the shunt on the solar cell substrate is proximate to the metallized grid pattern. This grid modification by shunt exclusion approach is further described below with reference to FIGS. 5-6B.

The grid modification by shunt disconnection approach involves breaking a portion of the metallized grid between the shunt and the bus bar portion of the metallized grid. A portion of the metallized grid, e.g., one of the grid lines, may be in electrical connection with the shunt, but this portion is disconnected from the bus bar portion. In some embodiments, a disconnected portion of the metallized grid may be in contact with multiple shunts. Thus, a single modification to the metallized grid may be used to address multiple shunts. This grid modification by shunt disconnection approach is further described below with reference to FIGS. 5 and 6C-6E.

In some embodiments, an approach for treating shunts on solar cell substrates may be made during the process design and method 200 proceeds according to this design without a separate decision operation. Alternatively, the decision may be made for every new substrate. In some embodiments, the decision on which approach can be used may be independently made for different portions of the substrate and even for different detected shunts. For example, one portion of the substrate may be processed using the shunt isolation approach, while another portion of the substrate may be processed using the grid modification approach. In some embodiments, multiple approaches may be combined. Specifically, the shunt isolation approach may be combined with one or both of the grid modification approaches.

If a shunt isolation approach is used, then method 200 proceeds with operation 210, which is outlined as a series of operations in FIG. 3. This series may start with depositing a positive photoresist onto a substrate and performing a soft bake during operation 302. The substrate includes multijunction stack, which may have one or more shunts. The positive photoresist is a type of photoresist in which the portion of the photoresist that is exposed to light becomes soluble to a photoresist developer solution. The portion of the photoresist that is unexposed remains insoluble to the developer solution. To the contrary, a negative photoresist is a type of photoresist in which the portion of the photoresist that is exposed to light becomes insoluble to the photoresist developer solution. The unexposed portion of the photoresist is dissolved by the photoresist developer. While this example refers to the positive photoresist, one having ordinary skills in the art would understand how to use a negative photoresist for the shunt isolation approach. Likewise, one having ordinary skills in the art would understand how to use a positive photoresist for the grid modification approach described below.

The softly baked photoresist is then exposed according to the pattern for the antireflective layer during operation 304. The exposure may be performed using a mask or other suitable techniques. FIG. 4A is a schematic top view of a substrate 400 illustrating the exposed area 402. In some embodiments, the area exposed during fabrication of the antireflective layer is substantially the same as the area exposed during fabrication of the metallized grid. However, a positive photoresist may be used during fabrication of the antireflective layer, while a negative photoresist may be used during fabrication of the metallized grid.

The area exposed during operation 304 is later removed during the development of the photoresist, which would allow deposition of the antireflective layer onto the multijunction stack not covered with the photoresist. Unexposed area 404 shown in FIG. 4, retains the photoresist during the development. The photoresist is eventually removed after depositing the antireflective layer together with any antireflective layer extending into this area. In the fabricated solar cell, the antireflective layer does not extend into the unexposed area. Instead, the unexposed area is covered with a metallized grid. In a conventional solar cell, the antireflective layer may not overlap with the metallized grid, since the antireflective layer is electrically insulating and will negatively impact current collecting capabilities of the metallized grid if allowed to extend between the multijunction stack and the metallized grid. However, when a method of treating shunts is used, an exposed area corresponding to the antireflective area may be modified to purposely extend the antireflective layer between the metallized grid and the multijunction stack in a particular area if a shunt is found in this area.

The method proceeds with identifying shunts proximate to the unexposed area during operation 306. In some embodiments, this operation may involve detecting an overlap between unexposed area 404 and shunts. If there is an overlap as, for example, shown in FIG. 4A with shunt 406 partially overlapping unexposed area 404, then the metallized grid will later come in contact with the shunt resulting in poor solar cell performance. In some embodiments, an offset area 405, which extends away from unexposed area 404, may be used during operation 306 for overlap consideration. If a shunt even partially overlaps with offset area 405, then this shunt may be considered proximate to the metallized grid pattern, which at this stage of processing corresponds to unexposed area 404. Overall, an overlap with offset area 405 rather than overlap with smaller unexposed area 404 may be used to ensure adequate electrical isolation between the shunts and metallized grid and to anticipate any tolerances during subsequent processing, such as tolerances of aligning different lithographic images.

In some embodiments, operation 306 only involves inspection of unexposed area 404 or offset area 405, if one is used. The remaining area may not be inspected as shunts in this remaining area will be away from the metallized grid and will not impact the performance of the solar cell. This focused inspection allows increasing the processing throughput.

In some embodiments, positions of shunts relative to the metallized grid pattern may be determined prior to exposing the antireflective pattern or any other exposed pattern. The inspection tool may use coordinates of the metallized grid pattern to perform the inspection instead of relying on the actual exposed pattern. These coordinates may be referred to as a virtual pattern of the metallized grid and may not correspond to any structures or images on the substrate surface at the time of inspection. If shunts proximate to the metallized grid pattern are identified during this virtual pattern inspection, then the initial exposure of the photoresist used to fabricate the antireflective layer and/or the initial exposure of the photoresist used to fabricate the metallized grid may be modified to address presence of these proximate shunts.

In some embodiments, proximity of shunts relative to the metallized grid pattern is detected even prior to making a decision, which approach to use, such as a shunt isolation approach, a grid modification by shunt disconnection approach, or a grid modification by shunt exclusion approach. In these embodiments, information about proximate shunts, which may be presented as a shunt map, may be used to select one or more of these approaches. This selection may be made for the entire substrate or portions or the substrate, such as portions including one or more shunts.

If no proximate shunts are detected, the method may proceed with developing photoresist during operation 312. In the case of the positive photoresist, the exposed photoresist will be removed while the unexposed photoresist will remain. During operation 314, an antireflective layer is then formed followed by removal of the remaining (unexposed) photoresist with any antireflective layer that may extend over this remaining photoresist. The resulting structure after this operation is a multijunction stack with the patterned antireflective layer that is ready to receive a metallized grid.

However, if one or more proximate shunts are detected, the method proceeds with exposing these shunt areas during operation 310. These areas, such as area 408 in FIG. 4A, may be referred to as additionally exposed areas as these areas extend beyond the standard exposed area 404 representing the standard antireflective area pattern. In some embodiments, an additionally exposed area is slightly larger than the area of the shunt to ensure adequate electrical isolation between the shunt and the metallized grid formed layer and to anticipate any fabrication tolerances of the future processes. These one or more additional exposures extend the antireflective layer (formed in later operations) over the shunts, thereby preventing the contact between the shunts and the metallized grid as further described below. In some embodiments, information about any shunts proximate to the metallized grid may be added to a shunt map or, more specifically, coordinates of the shunt may be added into the shunt map. This information in the shunt map may be then used for determining location, shape, and size of the portion for exposure on the solar cell substrate in order to treat the shunts. For example, the coordinates of the shunts added to the shunt map may be analyzed during this determining operation.

The method then proceeds with developing photoresist during operation 312 and forming a patterned antireflective layer during operation 314 as described above. As a result of this additional exposure, the photoresist in these newly exposed areas, such as area 408 in FIG. 4A, is also removed and the antireflective layer is deposited over the shunt. Even though the metallized grid will later extend over area 408, the metallized grid will not physically contact or form an electrical connection with the shunt since the antireflective layer deposited in this area will isolate the metallized grid from the shunt as will now be described in more details with reference to FIG. 4B.

Specifically, FIG. 4B illustrates a cross-sectional view of a solar cell 410 formed from the substrate shown in FIG. 4A. The cross-sectional view corresponds to the A-A cross section indicated in FIG. 4A, which includes the shunt. Solar cell 410 includes the substrate having multijunction stack 418 having shunt 416. Solar cell 410 also includes metallized grid 414 and patterned antireflective layer 412 formed over multijunction stack 418. While metallized grid 414 contacts multijunction stack 418 in most locations, metallized grid 414 is isolated from multijunction stack 418 in the area of shunt 416 by a portion of antireflective layer 412. In other words, antireflective layer 412 is disposed between shunt 416 and metallized grid 414. It should be noted that this shunt isolation approach allows maintaining continuity within metallized grid 414 and disconnect metallized grid 414 from multijunction stack 418 only where shunts are present in multijunction stack 418. As such, current collection capabilities of metallized grid 414 are only marginally impacted and are limited to the shunt area proximate to the metallized grid. At the same time, current conducting capabilities of metallized grid 414 are not impacted at all contrary to the grid modification approaches further described below.

Returning to FIG. 2, operation 210 may be followed by forming a metallized grid during operation 212. As noted above, prior to operation 212, any shunts detected within proximity of the metallized grid patterns are covered by an antireflective layer. As such, the metallized grid formed during operation 212 will not contact these shunts.

If method 200 uses the grid modification approach, then after removing the growth substrate in operation 206, a patterned antireflective layer is formed during operation 220. Unlike with the shunt isolation approach, the patterned antireflective layer formed during operation 220 is not modified based on detection of shunts within proximity of the metallized grid pattern. In fact, the substrate may not be inspected for shunts prior to operation 220. The antireflective layer formed during operation 220 follows the standard pattern.

Following operation 220, a metallized grid is formed on the substrate during operation 222. However, unlike with the shunt isolation approach, the metallized grid is modified in this approach. Specifically, the metallized grid may be modified to exclude the areas of the shunt as in the grid modification by shunt exclusion approach or do not extend to the bus portion of the metallized grid as in shunt disconnection approach. Details of operation 222 will now be described with reference to FIG. 5.

Figure 5:
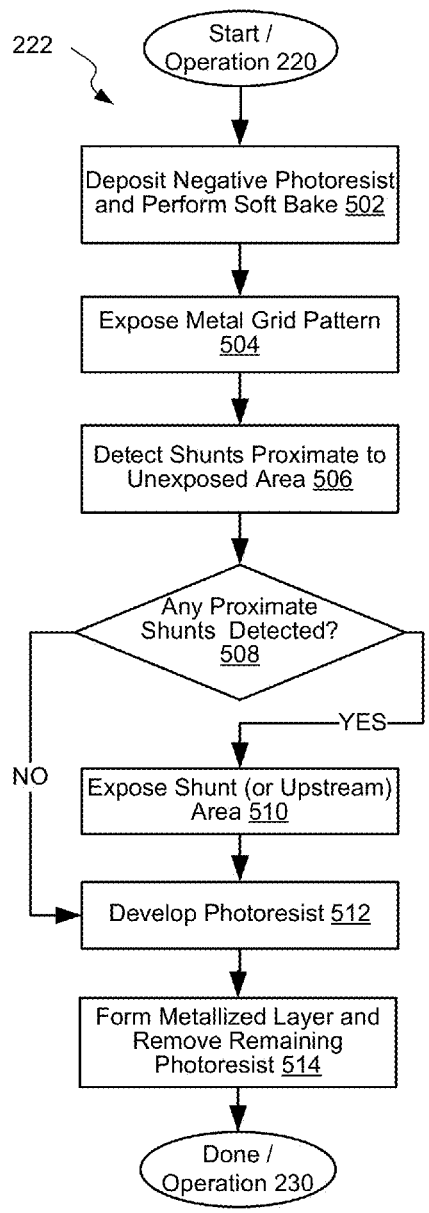
FIG. 5 is a process flowchart corresponding to another method for treating shunts on solar cell substrates, in accordance with some embodiments.

FIG. 5 illustrates a series of operations corresponding to the grid modification approach, in accordance with some embodiments. As noted above, the grid modification approach could be divided into the grid modification by shunt exclusion approach and the grid modification by shunt disconnection approach. The difference between these two approaches is set by operation 510 and described below in more details.

Figure 6A:
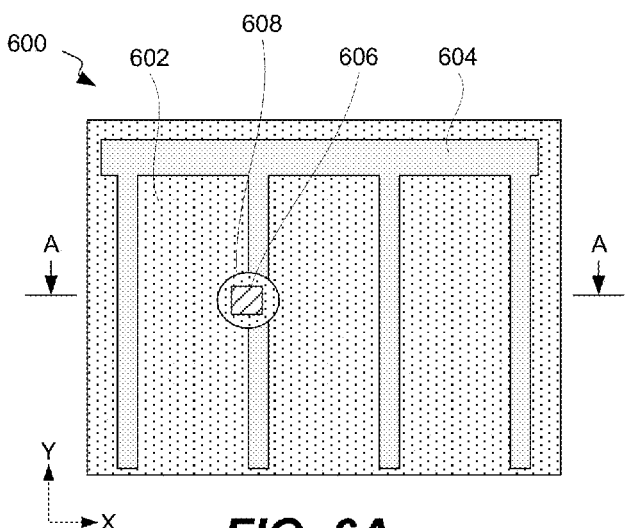
FIG. 6A is a schematic top view of a solar cell substrate after treating the shunt in accordance with operations depicted in FIG. 5.

This series of operations may proceed with depositing a negative photoresist and perform soft bake during operation 502. As noted above, one having ordinary skills in the art would understand how to use either the negative photoresist or the positive photoresist for this operation. A metallized grid pattern is then exposed on the photoresist. FIG. 6A illustrates a top schematic view of a solar cell substrate 600 having exposed area 602 for the negative photoresist. Unexposed area 604 corresponds to the metallized grid. The method then proceeds with operation 506 during which any shunts proximate to the unexposed area are identified. This operation is similar to detection operation 306 described above with reference to FIG. 3 and may use various criteria, such as an overlap with the metallized grid pattern, an overlap with an offset area surrounding the metallized grid pattern, and other criteria. Furthermore, similar to operation 306, operation 506 may be performed before operation 504 using virtual patterns. In some embodiments, operation 506 may be used to select an approach to use.

If no shunts proximate to the metallized grid pattern are found, then the process proceeds with developing photoresist during operation 512. In the case of the negative photoresist, the exposed photoresist will remain while the unexposed photoresist will be removed. During operation 514, a metallized layer is formed followed by removal of the remaining (exposed) photoresist with any metallized layer that may extend over this remaining photoresist. The resulting structure after this operation is a multijunction stack with the metallized grid as well as with the patterned antireflective layer formed in the previous operations.

However, if one or more shunts are found proximate to the metallized grid pattern, then the process proceeds with exposing one or more portions of the photoresist overlaying these shunts when the grid modification by shunt exclusion approach is used. In the same or other embodiments, the process may proceed with exposing a portion of the metallized grid pattern that extends between the shunt and the bus portion, which will result in forming a disconnected portion of the metallized grid pattern. This disconnected portion may still have contact with one or more shunts, but the shunts will not be exposed to the potential of the metallized grid and, as such, will limit the performance impact on the cell. This approach is referred to as a grid modification by shunt disconnection approach. Each of these approaches will now be described in more detail.

In the grid modification by shunt exclusion approach, an area over the shunt that is proximate to the metallized grid pattern is exposed in order to prevent formation of the metallized grid in this area. This area may include the actual area of the shunt and, in some embodiments, some additional offset area to ensure adequate electrical isolation between the shunts and metallized grid and to anticipate any future fabrication tolerances. The operations then proceed with developing photoresist during operation 512 and forming a metallized grid during operation 514 as described above. Because the metallized grid pattern is modified and the grid is excluded from the shunt areas, the shunts are disconnected from the grid. This modification of the grid may cause an entire grid line to be disconnected from the bus portion. In some embodiments, only a portion of the line is impacted. For example, a grid line may have only a partial overlap with a shunt and the grid line is only partially cut.

As a result of this additional exposure of the shunt area during operation 510, the photoresist in this newly exposed area 608 will be also retained and the metallized grid will be excluded from in this additionally exposed area. Even if the metallized grid temporarily extends over area 608, this metallized grid portion will be removed during operation 514.

Figure 6B:
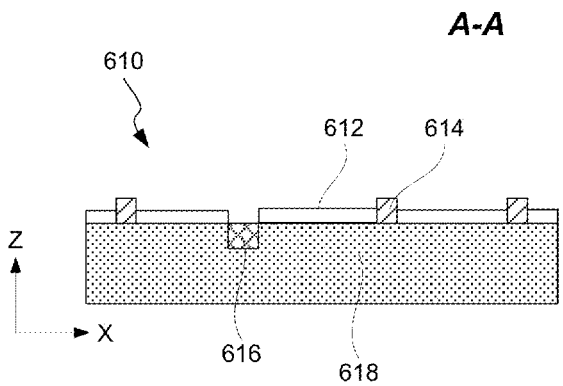
FIG. 6B is a schematic cross-sectional view of a solar cell that included the solar cell substrate and the treated shunt illustrated in FIG. 6A, in accordance with some embodiments.

FIG. 6B illustrates a cross-sectional view of a solar cell 610, in accordance with some embodiments. This view may correspond to cross-section line A-A in FIG. 6A, which is the line extending through the shunt. Solar cell 610 includes multijunction stack 618 having shunt 616. Solar cell 610 also includes metallized grid 414 and patterned antireflective layer 412. While metallized grid 614 contacts multijunction stack 618 in most of the location, metallized grid 614 is excluded from the area of shunt 616.

In the grid modification by shunt disconnection approach, the shunt may be allowed to come in contact with a portion of the metallized grid. However, this area is disconnected from the bus area of the metallized grid by exposing a portion of the metallized grid pattern during operation 510. This exposed portion does not have to overlap the shunt. Instead, this exposed portion may extend across the entire grid line to electrically disconnect the grid portion contacting the shunt from the bus portion of the metallized grid. This approach will now be described in more detail with reference to FIGS. 6C-6E.

Figure 6C:
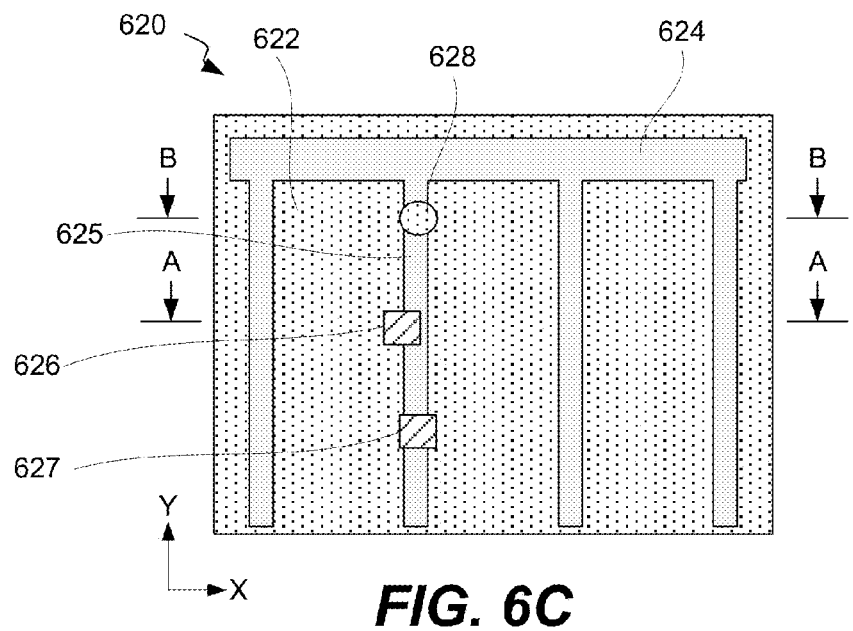
FIG. 6C is a schematic top view of another solar cell substrate after treating the shunt in accordance with operations depicted in FIG. 5.

Specifically, FIG. 6C is a schematic top view of a solar cell substrate 620 having a photoresist with exposed area 622. The remaining area is unexposed and corresponds to the metallized grid pattern. This pattern includes a grid line portion 625 and a bus portion 624. The unexposed area later receives a metallized grid, while exposed area is kept free of the metallized grid. A shunt 626 is shown to contact one of grid line portion 625 of the unexposed area. In some embodiments, the same grid line may contact another shunt 627. Instead of exposing the area of shunt 626 (as in the grid modification by shunt exclusion approach), this grid modification by shunt disconnection approach exposes a portion 628 of the metallized grid pattern in between grid line portion 625 and bus pattern portion 624. As a result, the portion of the grid contacting shunts 626 and 627 will be electrically disconnected from to bus portion 624. As such, a single additional exposure may be used for treating multiple shunts in this approach. Of course, in other approaches, an additional exposed area may be large enough to cover multiple shunts.

Figure 6D:
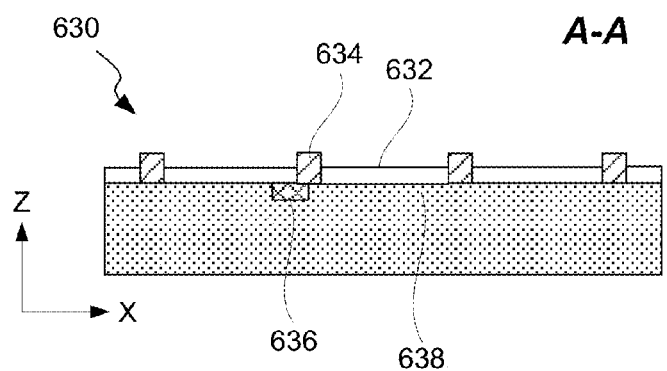
FIG. 6D is a first schematic cross-sectional view of a solar cell including the substrate and the treated shunt shown in FIG. 6C, in accordance with some embodiments.
Figure 6E:
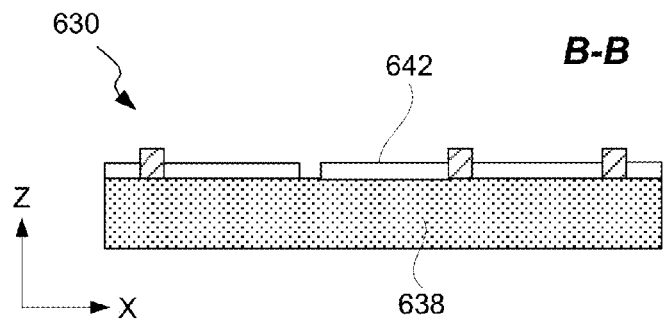
FIG. 6E is a second schematic cross-sectional view of the solar cell including the substrate and the treated shunt shown in FIG. 6C, in accordance with some embodiments.

FIG. 6D is a schematic cross-sectional view of a solar cell 630 corresponding to line A-A in FIG. 6C, which extends through shunt 626. Cell 630 includes multijunction stack 638 having shunt 636. Shunt 636 contacts a portion 634 of the metallized grid pattern. However, portion 634 is not connected to the bus portion of the metallized grid pattern due to additionally exposed area 628. FIG. 6E is another schematic cross-sectional view of solar cell 630 corresponding to line B-B in FIG. 6C, which extends through additionally exposed area 628. As shown, portion 634 of the metallized grid pattern is not present in this cross-sectional view.

Examples of Inspection Apparatuses

Figure 7:
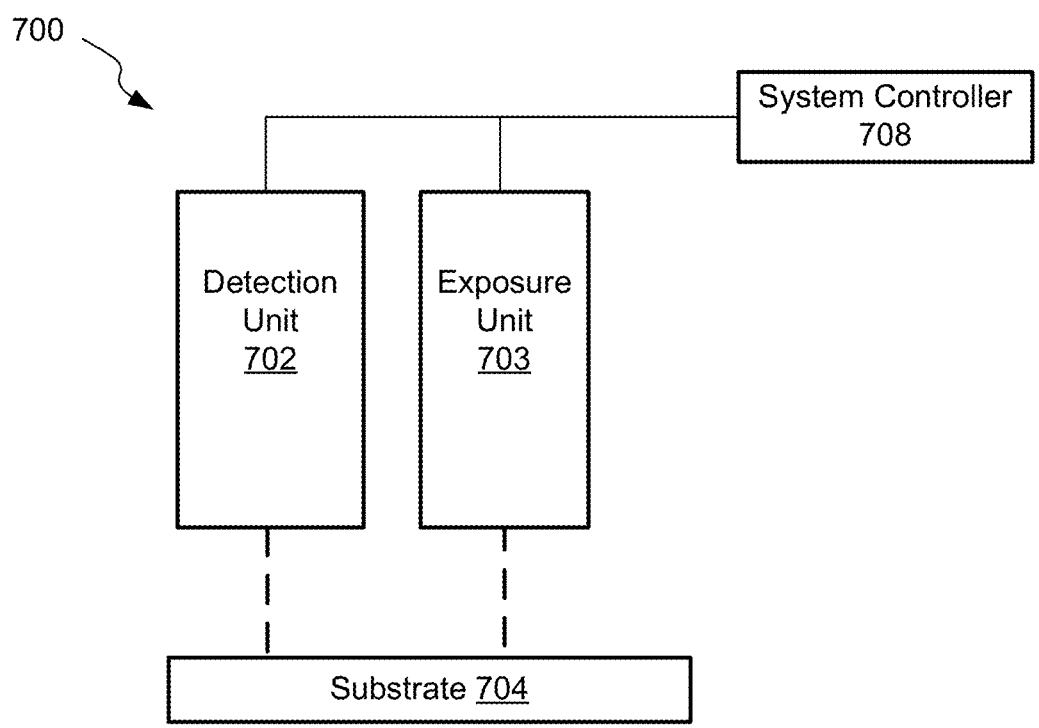
FIG. 7 is a schematic representation of an apparatus for treating shunts on solar cell substrates, in accordance with some embodiments.

FIG. 7 is a schematic representation of an apparatus 700 for treating shunts on solar cell substrates, in accordance with some embodiments. Apparatus 700 may include a detection unit 702 configured to detect a shunt on a solar cell substrate 704 proximate to a metallized grid pattern. For example, an optical system with surface inspection capabilities may be used for this purpose. The output of detection unit 702 may be provided into system controller 708. System controller 708 may also control operation of detection unit 702. For example, system controller 708 may specify an inspection area, such as a virtual map of metallized grid pattern.

Apparatus 700 may also include an exposure unit 703 configured to expose a portion of a photoresist disposed on a surface of the solar cell substrate. Exposure unit 703 may be capable of exposing both positive and negative photoresists. In some embodiments, exposure unit 703 may be also used to expose a pattern of the antireflective layer and/or a metallized grid pattern. As noted before, additional exposure performed based on detecting proximate shunts may be performed before, during, or after exposing a pattern of the antireflective layer and/or a metallized grid pattern.

System controller 708 may instruct exposure unit 703 to expose additional area based on locations of shunts proximate to the metallized grid pattern. In some embodiments, system controller 708 includes a computer system programmed to process information containing locations of the proximate shunts and output location, shapes, and sizes for additional exposures. Various examples of computer systems are presented below with reference to FIG. 8. In some embodiments, the exposed portion of the photoresist covers an entire area of the shunt or cuts across a portion of the metallized grid pattern extending between the shunt and a bus portion of the metallized grid pattern.

As noted above, detection unit 702 and exposure unit 703 may be in communication with system controller 708. In some embodiments, detection unit 702 and exposure unit 703 may communicate directly regardless of presence of the controller. For example, detection unit 702 may be configured to communicate a location of the shunt on the solar cell substrate to exposure unit 703. In some embodiments, detection unit 702 and exposure unit 703 are integrated into the same body and represent the same unit.

In some embodiments, detection unit 702 is configured to construct a shunt map that includes location of all shunts on the solar cell substrate 704 within the area associated with a metallized grid pattern. For example, when a proximate shunt is detected, its coordinates may be added into a shunt map. Later these coordinates may be used to determine location, shape, and size of the portion for exposure on the solar cell substrate.

Detection unit 702 may be also configured to communicate this shunt map to system controller 708, exposure unit 703, and/or external devices.

Examples of Controller Computer Systems

Figure 8:
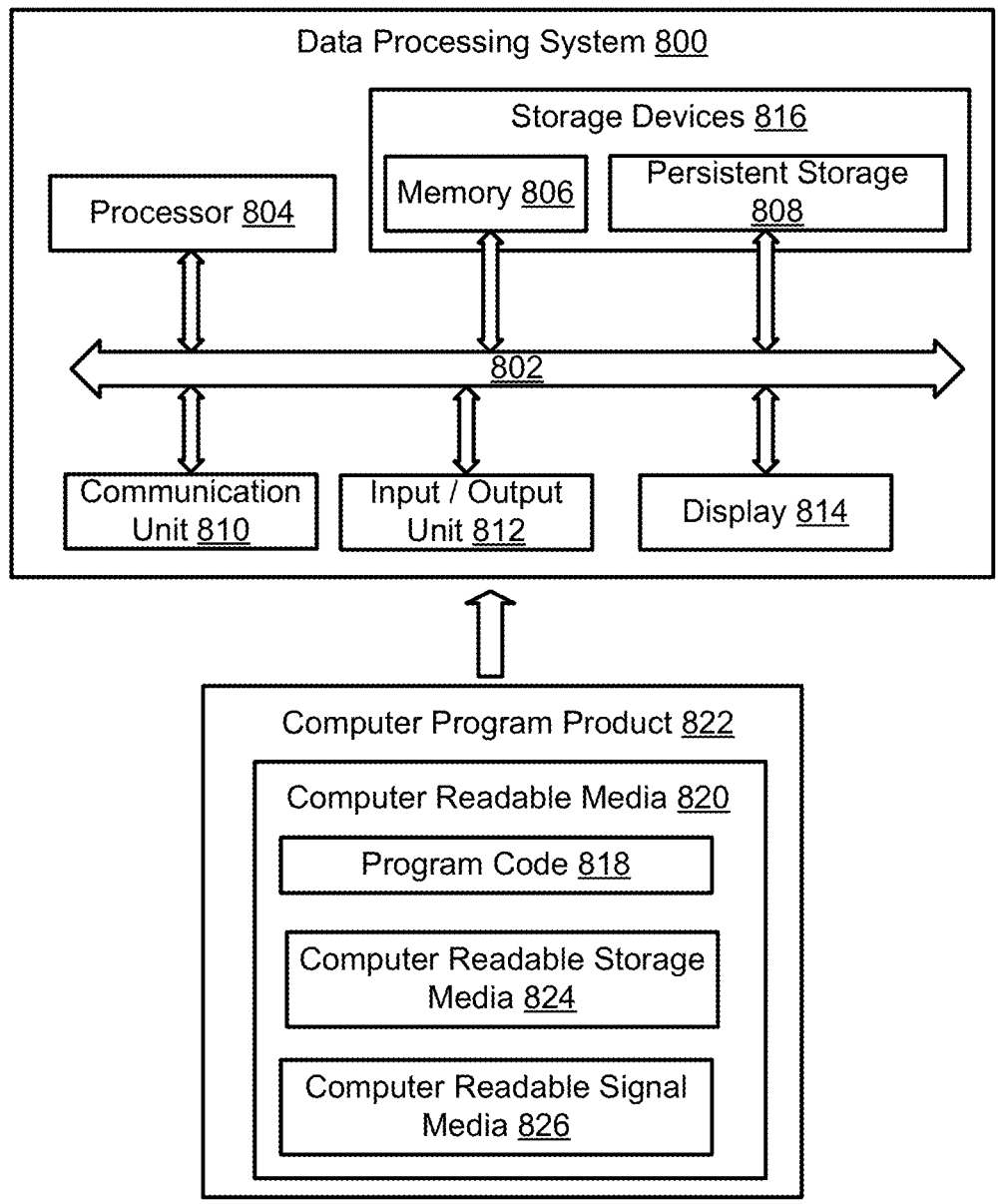
FIG. 8 is a block diagram illustrating a data processing system used for treating shunts on solar cell substrate, in accordance with some embodiments.

Turning now to FIG. 8, an illustration of a data processing system 800 is depicted in accordance with some embodiments. Data processing system 800 may be used to implement one or more computers used in a controller or other components of various systems described above and to execute various operations, such as detecting shunts on solar cell substrates proximate to metallized grid patterns and exposing portions of the photoresists disposed on surfaces of the solar cell substrates. For example, data processing system 800 may be used to determine additional exposure portions of the substrate in accordance with various approaches described above.

In some embodiments, data processing system 800 includes communications framework 802, which provides communications between processor unit 804, memory 806, persistent storage 808, communications unit 810, input/output (I/O) unit 812, and display 814. In this example, communications framework 802 may take the form of a bus system. Processor unit 804 serves to execute instructions for software that may be loaded into memory 806. Processor unit 804 may be a number of processors, a multi-processor core, or some other type of processor, depending on the particular implementation.

Memory 806 and persistent storage 808 are examples of storage devices 816. A storage device is any piece of hardware that is capable of storing information, such as, for example, without limitation, data, program code in functional form, and/or other suitable information either on a temporary basis and/or a permanent basis. Storage devices 816 may also be referred to as computer readable storage devices in these illustrative examples. Memory 806, in these examples, may be, for example, a random access memory or any other suitable volatile or non-volatile storage device. Persistent storage 808 may take various forms, depending on the particular implementation. For example, persistent storage 808 may contain one or more components or devices. For example, persistent storage 808 may be a hard drive, a flash memory, a rewritable optical disk, a rewritable magnetic tape, or some combination of the above. The media used by persistent storage 808 also may be removable. For example, a removable hard drive may be used for persistent storage 808.

Communications unit 810, in these illustrative examples, provides for communications with other data processing systems or devices. In these illustrative examples, communications unit 810 is a network interface card.

Input/output unit 812 allows for input and output of data with other devices that may be connected to data processing system 800. For example, input/output unit 812 may provide a connection for user input through a keyboard, a mouse, and/or some other suitable input device. Further, input/output unit 812 may send output to a printer. Display 814 provides a mechanism to display information to a user.

Instructions for the operating system, applications, and/or programs may be located in storage devices 816, which are in communication with processor unit 804 through communications framework 802. The processes of the different embodiments may be performed by processor unit 804 using computer-implemented instructions, which may be located in a memory, such as memory 806.

These instructions are referred to as program code, computer usable program code, or computer readable program code that may be read and executed by a processor in processor unit 804. The program code in the different embodiments may be embodied on different physical or computer readable storage media, such as memory 806 or persistent storage 808.

Program code 818 is located in a functional form on computer readable media 820 that is selectively removable and may be loaded onto or transferred to data processing system 800 for execution by processor unit 804. Program code 818 and computer readable media 820 form computer program product 822 in these illustrative examples. In one example, computer readable media 820 may be computer readable storage media 824 or computer readable signal media 826.

In these illustrative examples, computer readable storage media 824 is a physical or tangible storage device used to store program code 818 rather than a medium that propagates or transmits program code 818.

Alternatively, program code 818 may be transferred to data processing system 800 using computer readable signal media 826. Computer readable signal media 826 may be, for example, a propagated data signal containing program code 818. For example, computer readable signal media 826 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 800 are not meant to provide architectural limitations to the manner in which different embodiments may be implemented. The different illustrative embodiments may be implemented in a data processing system including components in addition to and/or in place of those illustrated for data processing system 800. Other components shown in FIG. 8 can be varied from the illustrative examples shown. The different embodiments may be implemented using any hardware device or system capable of running program code 818.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for treating shunts on solar cell substrates, the method comprising:
   detecting a shunt on a solar cell substrate proximate to a metallized grid pattern; and
   exposing a portion of a photoresist disposed on a surface of the solar cell substrate,
      wherein the exposed portion of the photoresist covers at least an overlap area of the shunt and the metallized grid pattern or cuts across a portion of the metallized grid pattern extending between the shunt and a bus portion of the metallized grid pattern.

2. The method of claim 1, further comprising forming the metallized grid on the solar cell substrate, wherein at least the bus portion of the metallized grid is electrically isolated from the shunt.

3. The method of claim 2, wherein the entire metallized grid is electrically isolated from the shunt.

4. The method of claim 3, wherein the metallized grid does not extend over the shunt.

5. The method of claim 3, wherein a portion of the metallized grid extends over the shunt, and wherein an antireflective layer extends between the shunt and the portion of the metallized grid extending over the shunt.

6. The method of claim 2, wherein a portion of the metallized grid extends over the shunts, the portion of the metallized grid electrically connected to the shunts and electrically disconnected from the bus portion of the metallized grid.

7. The method of claim 1, wherein detecting the shunt comprises adding coordinates of the shunt into a shunt map, and wherein exposing the portion of the photoresist comprises analyzing the coordinates of the shunt and determining location, shape, and size of the portion for exposure on the solar cell substrate.

8. The method of claim 7, wherein detecting the shunt is performed using a detection unit, wherein exposing the portion of the photoresist is performed using an exposure unit, and wherein the detection unit transmits the shunt map to the exposure unit.

9. The method of claim 1, wherein detecting the shunt comprises optical inspection of an area proximate to the metallized grid pattern.

10. The method of claim 1, wherein detecting the shunt is performed after exposing an antireflective pattern on the photoresist, the antireflective pattern defining the metallized grid pattern.

11. The method of claim 1, wherein detecting the shunt is performed after exposing the metallized grid pattern on the photoresist.

12. The method of claim 1, wherein detecting the shunt comprises determining an overlap between the shunt and the metallized grid pattern.

13. The method of claim 12, wherein detecting the shunt further comprises determining an overlap between the shunt and an offset area surrounding the metallized grid pattern.

14. The method of claim 1, wherein the solar cell substrate is a part of an inverted and wafer bonded solar cell.

15. The method of claim 1, further comprising, prior to detecting the shunt,
   forming an inverted solar cell stack on a growth substrate;
   bonding the inverted solar cell stack to a new substrate,
      wherein the new substrate comprises one of an inactive handle or an active cell substrate,
   removing the growth substrate forming a stack surface; and
   depositing the photoresist onto the stack surface.

16. An inverted and wafer bonded solar cell comprising:
   a substrate comprising one of an inactive handle or an active cell substrate;
   an inverted solar cell stack disposed over the substrate, the inverted solar cell stack comprising a shunt; and
   a metallized grid disposed over the inverted solar cell stack such that the inverted solar cell stack is disposed between the metallized grid and the substrate,
      wherein the shunt is disconnected from at least a bus portion of the metallized grid by at least one of (i) an antireflective layer extending between the shunt and a portion of the metallized grid extending over the shunt, (ii) the metallized grid not extending over the shunt, or (iii) a portion of the metallized grid extending over and contacting the shunt being disconnected from the bus portion of the metallized grid.

17. The inverted and wafer bonded solar cell of claim 16, further comprising an additional shunt, wherein the portion of the metalize grid extending over and contacting the shunt also extends over the contacts the additional shunt, and wherein the shunt and the additional shunt are disconnected from the bus portion of the metallized grid by the portion of the metalize grid being disconnected from the bus portion of the metallized grid.

18. An apparatus for treating shunts on solar cell substrates, the apparatus comprising:
   a detection unit configured to detect a shunt on a solar cell substrate within an area associated with a metallized grid pattern; and
   an exposure unit configured to expose a portion of a photoresist disposed on a surface of the solar cell substrate,
      wherein the exposed portion of the photoresist covers at least an overlap area of the shunt and the metallized grid pattern or cuts across a portion of the metallized grid pattern extending between the shunt and a bus portion of the metallized grid pattern, and
      wherein the detection unit is configured to communicate a location of the shunt on the solar cell substrate to the exposure unit.

19. The apparatus of claim 18, wherein the exposure unit is further configured to expose one or more of the metallized grid pattern and an antireflective layer pattern.

20. The apparatus of claim 18, wherein the detection unit is configured to add coordinates of the shunt into a shunt map, the shunt map comprising coordinates of shunts on the solar cell substrate that are proximate to the metallized grid pattern.

* * * * *